United States Patent [19]

Eager et al.

[11] Patent Number: 4,734,872
[45] Date of Patent: Mar. 29, 1988

[54] TEMPERATURE CONTROL FOR DEVICE UNDER TEST

[75] Inventors: George Eager; Pater Selverstone, both of Cambridge, Mass.

[73] Assignee: Temptronic Corporation, Newton, Mass.

[21] Appl. No.: 728,860

[22] Filed: Apr. 30, 1985

[51] Int. Cl.⁴ .............................................. G01K 17/00
[52] U.S. Cl. ................. 364/557; 324/73 PC; 364/174; 374/57; 374/135
[58] Field of Search ............. 364/557, 162, 174, 183, 364/477; 374/39, 57, 135, 138; 324/158 F, 73 PC, 158 R

[56] References Cited

U.S. PATENT DOCUMENTS

| | | | |
|---|---|---|---|
| 3,691,840 | 9/1972 | Datour et al. | 374/135 |
| 3,979,671 | 9/1976 | Meeker et al. | 324/158 F |
| 4,102,150 | 7/1978 | Kountz | 364/557 |
| 4,112,589 | 9/1978 | Palfrey et al. | 34/48 |
| 4,286,391 | 9/1981 | Gerry | 34/44 |
| 4,397,101 | 8/1983 | Richard | 34/30 |
| 4,426,619 | 1/1984 | Demand | 324/73 PC |
| 4,437,771 | 3/1984 | Cazzaniga | 374/39 |
| 4,604,572 | 8/1986 | Hariuchi et al. | 324/158 F |

OTHER PUBLICATIONS

Wills: Cascade Control: When, Why and How Automatic Control, Sep. 1961, pp. 36-39.
Robert J. Bibbero, "Microprocessor in Instruments and in Control," John Wiley & Sons, New York, 1977, pp. 155-175.
Katshuhiko Ogata, "Modern Control Engineering," Prentice-Hall, Inc., Englewood Cliffs, N.J., 1970, pp. 151-159.

*Primary Examiner*—Felix D. Gruber
*Attorney, Agent, or Firm*—Schiller, Pandiscio & Kusmer

[57] ABSTRACT

A system for and method of precisely controlling the temperature of an electronic component through a range of temperatures by controlling the temperature of a gas forced into contact with the component is disclosed. The system comprises a dual control loop including two sensors, one for measuring the temperature of the gas and the other for sensing the temperature of the component, for controlling the temperature of the gas so as to provide accurate control of the temperature of the component.

17 Claims, 13 Drawing Figures

U.S. Patent  Mar. 29, 1988  Sheet 1 of 5  4,734,872
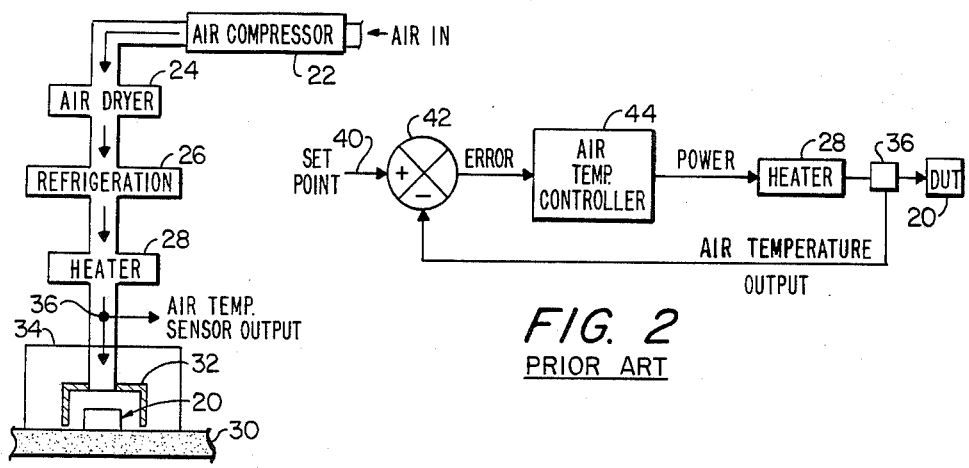
FIG. 1
PRIOR ART
FIG. 2
PRIOR ART
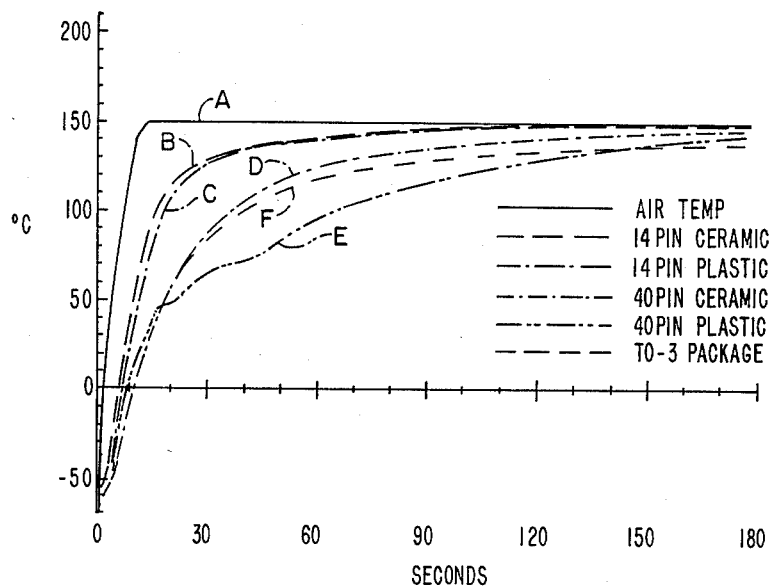
FIG. 3
PRIOR ART

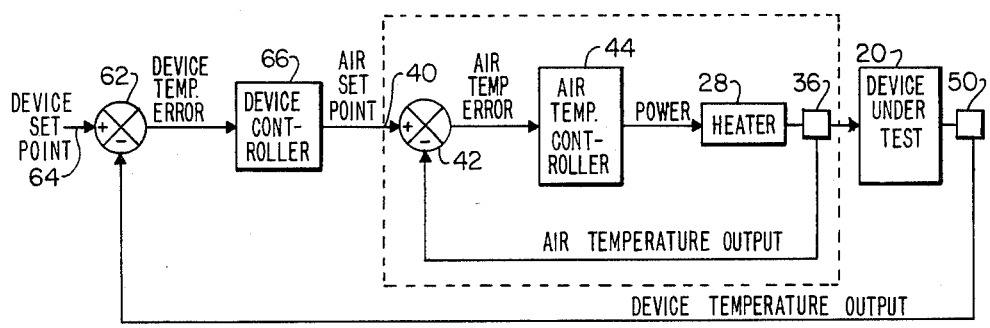

FIG. 8

```
100         DEVICE TEMPERATURE CONTROLLER
110
120  K1=.5@ K2=.5                    CONTROL CONSTANTS
121  I=0@ F=1
122  INPUT S                         GET DEVICE SETPOINT
140  REMOTE 9                        REMOTE IEEE BUS
150  OUTPUT 901 ; "TEM3"             INITIALIZE DATA ACQ SYS
170  ON TIMER# 1.2000 GOSUB 500      INTERRUPT EVERY 2 SEC
180
200  IF F=1 THEN 200                 WAIT UNTIL DATA AVAILABLE
205  DISP 0 @ F=1                    DISPLAY DEV TEMP
210  GOTO 200
400
500         INTERRUPT SERVICE ROUTINE
510
515  F=0
520  ENTER 901 ; 0                   READ DEV TEMP
522  E=S-0                           CALCULATE ERROR
523  P=K1*E                          PROPORTIONAL TERM
524  I=I+K2*E                        INTEGRAL TERM ACCUMULATES
526  IF I>10 THEN I=10               SATURATION LIMITS ON I
527  IF I<-10 THEN I=-10
528  A=S-P-I                         CALCULATE NEW AIR SETPOINT
530  IF A>200 THEN A=200             BUT NOT BEYOND LIMITS
532  IF A<-70 THEN A=-70
540  OUTPUT 902 ; "RS"; INT(A+.5)    SEND A TO AIRSTREAM. ROUNDED
550  TRIGGER 901                     TRIGGER NEXT READING
560  RETURN                          FROM INTERRUPT
999  END
```

FIG. 12

TEMPERATURE CONTROL FOR DEVICE UNDER TEST

The present invention relates generally to the testing of electronic component devices, and more particularly to systems for and methods of precisely controlling the temperature of such devices through a range of temperatures so that such devices can be tested at temperatures within the range.

When testing objects, such as electrical component devices, e.g., wafers, integrated circuits, printed circuits, hybrid circuits, as well as small systems using such electrical component devices, such as pacemakers and the like, it is often important to test these objects at various temperatures throughout a range of temperatures. Thus, it is important to the accuracy of such testing to control the temperature of the object or device under test (hereinafter referred to as the "DUT") as accurately and precisely as possible. One approach has been to test the DUTs in a temperature controlled chamber. See, for example, the system shown and described in U.S. Pat. No. 4,426,619, issued to Erhart E. Demand on Jan. 17, 1984 and assigned to the present assignee. However, sometimes DUTs must be electrically tested at high frequencies, e.g., the gigahertz region, and low currents, e.g., the nanoampere region. Under such conditions testing chambers are not as feasible because of the relatively long leads between the DUT and the test circuitry. As a result, various systems have developed over the years for testing the DUT at the test socket.

One system is the temperature controlled head or probe system (such as the model TP250 system currently being sold by Temptronic Corporation of Newton, Massachusetts, the present assignee, under the trademark ThermoProbe). This system controls the temperature of the DUT at the test socket by directly contacting the component device with a probe head. However, such thermal contact is not always satisfactory since the contact is made from only one side of the component, usually the top. This can create non-uniform temperatures in the DUT while the latter is being tested.

Another alternative system has been developed in which a temperature controlled airstream is forced into contact with the DUT. One example of such a system is the externally programmable TP0412A ThermoStream System sold by the present assignee, Temptronic Corporation of Newton, Mass. under the trademark ThermoStream (hereinafter referred to as the "ThermoStream System"). In the ThermoStream System a localized temperature controlled airstream is directed at the component, thereby surrounding it in a high velocity thermal environment assuring (a) a small temperature gradient between the airstream and the DUT, and (b) a substantially uniform temperature throughout the DUT. In this system the control sensor for controlling the temperature of the airstream is located in the airstream close to the DUT so as to provide high stability and good environmental control. To minimize the temperature gradient from the airstream to the DUT, care has been exercised to sufficiently localize the airstream, producing sufficiently high air velocity around the DUT thus increasing the heat transfer coefficient. Further, good interface/fixturing practices have been developed in the ThermoStream System to isolate the DUT from tester parts at ambient temperature. Such practices have also prevented the transfer of heat from the tester parts exposed to ambient air to the DUT, thus reducing or eliminating condensation on live circuits when the DUT is tested at lower temperatures. When testing at high temperatures, the negative effect of transferring heat into the tester also has been eliminated.

While most test activities can be carried out successfully in the above-described airstream system, some limitations do exist, and in some applications cannot be ignored. One such limitation relates to the fact that it is usually necessary to provide a temperature offset between the initial setting of the temperature of the airstream and the desired targeted airstream temperature, since the actual airstream temperature tends to approach the desired set temperature asymptotically. This desirable offset depends on the size, materials and configuration of the DUT, as well as the thermal structure surrounding the DUT. If the size of the DUT does not vary substantially, this offset can be effected by offsetting the temperature calibration of the system itself to produce a predetermined offset with each temperature setting. However, this is not always the situation.

Further, with a preselected offset, the time required to bring the DUT to the desired temperature is reduced but by no means maximized. To further improve this, the externally programmable ThermoStream System has been programmed with an open loop control technique of initially supplying an "overshoot" temperature lower than a lower offset temperature or higher than a higher offset temperature, so that the actual temperature of the air approaches the desired temperature more quickly. Once the actual temperature of the air is at the desired temperature, the programmed temperature is automatically changed to the desired temperature or to a predetermined, minimal offset temperature. The overshoot temperature, as well as the dwelling times at the offset temperatures, are established empirically.

This combination of programming and calibration appears relatively simple but it does require some effort for each DUT of substantially different configuration since the offset can vary for each such configuration. Further, the offset for a particular DUT may vary over the temperature range of interest. Additionally, the open loop technique of providing an "overshoot" temperature will not compensate for internal heat dissipation of the DUT, which can also give rise to errors. Finally, the technique can be influenced by external disturbances, such as changes in the flow rate of the airstream.

Substituting a sensor for detecting the temperature of the DUT for the sensor for detecting the temperature of the airstream has been attempted, as described below. However, this approach has not been satisfactory. The device and its fixturing must be included in the single control loop for controlling the temperature of the airstream. Since the time constants and heat transfer characteristics of the user's application can not be known in advance, control stability and performance can be a problem. Further, if the sensor is mounted on top of the device in the airstream, its output will be some weighted average of the DUT and air temperatures. The DUT sensor should therefore be shielded from the high velocity airstream. The usual practice with integrated circuits is to center a thermocouple or the bottom of the surface of the package, the area generally closest to the circuit die.

Such a single control loop controller senses the DUT temperature and regulates the power to the heater unit to bring the DUT temperature to a setpoint. Optimization of the system is difficult since the thermal characteristics of the DUT and fixturing holding the DUT are significantly different from those of the heater/airstream system that the controller was designed to regulate. If the sensor is shielded from the airstream in order to accurately measure DUT temperature, the system is difficult to stabilize and extremely sensitive to DUT thermal characteristics. When the system is unstable, the air temperature can oscillate and may swing between system limits. This may stress or damage the DUT.

It is, therefore, a general object of the present invention to substantially reduce or overcome the above noted disadvantages of the above-described prior art.

A more specific object of the present invention is to provide an improved system for and method of precisely controlling the temperature of a DUT through a range of temperatures.

Another object of the present invention is to provide an improved forced airstream system including means for directly measuring the temperature of a DUT.

And another object of the present invention is to provide an improved forced airstream system which quickly and accurately brings the temperature of a DUT to the desired preset temperature regardless of the size, configuration or internal heat dissipation of the DUT.

Still another object of the present invention is to provide an improved temperature control system for and method of precisely controlling the temperature of a DUT through a range of temperatures by directly measuring the temperature of the DUT.

Yet another object of the present invention is to improve the ThermoStream System, with only minor modifications needed to directly measure and control the DUT temperature by controlling the temperature of the airstream.

And still another object of the present invention is to provide an improved temperature controlled system and method which virtually eliminate a required offset between the set point and measured temperatures of a DUT during steady state conditions.

And yet another object of the present invention is to provide an improved system for and method of controlling the temperature of an object under test, wherein the system and method allow the temperature of the airstream to vary when the DUT is held at a steady state temperature.

And still another object of the present invention is to allow the airstream temperature in an airstream temperature controlled system and method to vary while holding a DUT at a steady state temperature allowing the DUT to dissipate varying amounts of heat.

And yet another object of the present invention is to provide a system for and method of controlling the temperature of a DUT in which the effects of the thermal characteristics of the DUT and fixturing on the control function are reduced.

And still another object of the present invention is to provide an improved system and method of controlling the temperature of a DUT, wherein the temperature of the DUT is directly measured in a more stable manner than the single loop control system described above.

And yet another object of the present invention is to provide an improved and stable system and method of controlling the temperature of a DUT, in which air temperature swings and oscillations will have less effect on the DUT, and reduce the chances of stress and damage to the DUT.

These and other objects are achieved by an improved system for precisely controlling the temperature of an object through a range of temperatures, the system comprising:

means for supporting the object;

means, responsive to a control signal, for controlling the temperature of a fluid;

means for forcing the temperature-controlled fluid into contact with the object so as to control the temperature of the object; and means for directly sensing the temperatures of the object and the temperature-controlled fluid and for generating the control signal as a function of the sensed temperatures.

The above objects and other objects are also acheived by a method of controlling the precise temperature of an object through a range of temperatures by controlling the temperature of a fluid forced into contact with the object so that the object can be tested at each of various temperatures within the range, the method comprising the steps of:

setting the desired temperature of the object within the range of temperatures;

measuring the temperature of the object;

determining the difference between the desired temperature of the object and the measured temperature of the object;

detemining the desired temperature of the fluid as a function of the difference between the desired temperature of the object and the measured temperature of the object;

measuring the actual temperature of the fluid; and controlling the temperature of the fluid as a function of the difference between the desired temperature and the actual temperature of the fluid.

Other objects of the invention will in part be obvious and will in part appear hereinafter. The invention accordingly comprises the apparatus possessing the construction, combination of elements, and arrangement of parts which are exemplified in the following detailed disclosure, and the scope of the application of which will be indicated in the claims.

For a fuller understanding of the nature and objects of the present invention, reference should be had to the following detailed description taken in connection with the accompanying drawings, wherein:

FIG. 1 is a schematic diagram of the prior art ThermoStream System for controlling the temperature of an airstream so as to control the temperature of a DUT, through a range of temperatures, so that the DUT can be tested at various temperatures throughout the range;

FIG. 2 is a block diagram of the prior art control system for controlling the airstream temperature in the FIG. 1 system;

FIGS. 3 and 4 are graphical representations illustrating the effect of mass on the rate of DUT temperature change in the FIG. 1 system;

FIG. 8 is a block diagram of the preferred control system for controlling the temperature of the DUT placed in the system of FIG. 5;

FIG. 12 is another example of a software program for implementing dual loop control in an existing ThermoStream System with minor modifications.

In the drawings the same numerals are used to refer to like or similar parts.

Figure 4:
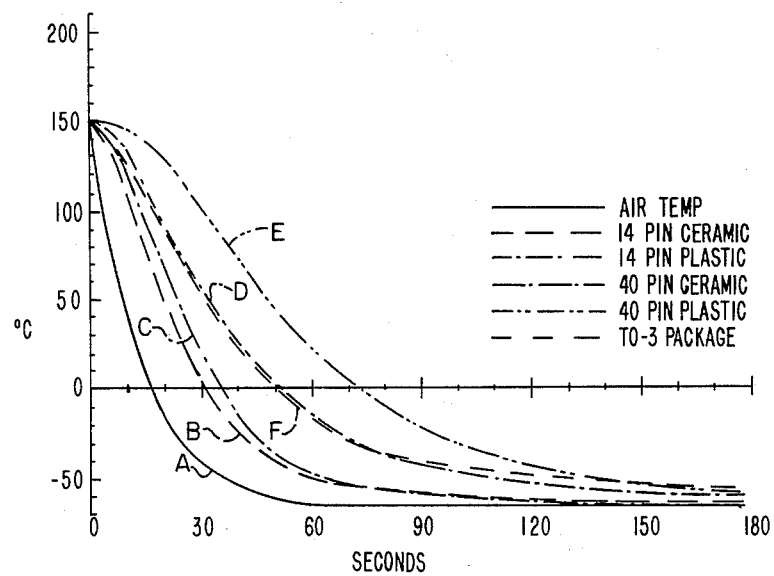

In FIG. 1 the prior art ThermoStream System, identified above, comprises an air compressor 22 for compressing air drawn into the system. The compressed air passes through an air dryer 24, a refrigeration unit 26 and a heater unit 28 prior to impinging the DUT 20 mounted on a tester board 30. The specific details of these components of the ThermoStream System are not shown or described since they are well known in the prior art. The DUT 20 is encased in a cap 32, which in turn is disposed within the enclosure 34. A sensor 36 is placed in the airstream between the heater unit 28 and the DUT 20 for sensing the temperature of the airstream before it impinges the DUT 20.

In operation the prior art system of the type shown in FIG. 1 is thus designed to heat or cool compressed air to a specified temperature and deliver it to the DUT 20. It does this in three basic steps. First, the compressed air is passed through the air dryer 24 to reduce the dew point of the air so as to minimize the chances of ice build-up in the cooling stages of the system. Next, the air is chilled by the refrigeration unit 26. Finally, the chilled air is heated by the heating unit 28 to the desired temperature. The sensor 36 is preferably a low mass thermocouple, placed directly in the airstream for measuring the temperature of the air as it exits the heating unit 28. Typical airstream systems, such as the ThermoStream System, are capable of delivering two to ten SCFM of air over a −70 to +200 degree Celsius temperature range. In the typical system the heating unit 28 permits the air temperature to be changed as much as 25 degrees Celsius per second.

Good airstream system performance requires rapid transition from one air temperature to another, minimal overshoot or undershoot when arriving at a temperature and very low deviation from steady state setpoints. To achieve this performance of critical damping and low steady state error, an airstream system requires a fairly sophisticated control system.

The control system, shown in FIG. 2, is designed to control the regulating power applied to the heating unit 28 so as to control the temperature of the airstream. The control system is provided with an input signal, indicated at 40, representative of the set point, i.e., the test temperature predetermined or set by the operator of the system. The set point input 40 is applied to a positive input of a signal summing point 42. The output of summing point 42 is applied to the air temperature controller 44. The summing point 42 and the controller 44 are typically formed by an information storage and retrieval system, such as a microprocessor of the type manufactured by Intel Corporation of California and sold as model 8085, although the controller can be easily implemented with analog and/or other digital circuitry. The output of controller 44 controls the power to the heating unit 28. The sensor 36 provides the feedback signal representative of the airstream temperature as it leaves the heating unit 28 before it impinges on the DUT 20. The feedback signal is applied to the negative input of the summing point 42 so that the output of the summing point 42 will be representative of the error difference between the set point temperature set by the operator and the actual temperature of the airstream measured by sensor 36.

The prior art controller 44 is programmed to perform a proportional-integral-derivative ("PID") algorithm optimized for minimum overshoot during setpoint transitions and adapted to closely regulate temperature while in a steady state condition. Such control algorithms are well known. See, for example, Bibbero, Robert J., Microprocessors in Instruments and Controls, John Wiley & Sons, New York, 1977, pp. 157–160. The derivative (anticipatory) control action of the PID algorithm is used to ensure stability of the system, while the integral control of this algorithm optimizes steady state performance, as is well known. The control time constants of this algorithm are preset by the manufacturer of the ThermoStream System so that the user is not required to perform the tedious process of controller optimization. The range of power delivered to heater unit 28 is of course a function of the capacity of the unit and is related to the air temperature error by a proportional factor.

The airstream system of the type shown in FIGS. 1 and 2 is thus designed to deliver temperature controlled air to the DUT 20. Most users, however, are concerned with the temperature induced in the DUT placed in the airstream. The rate at which the temperature of a DUT can be changed and the ultimate temperature achieved are functions of several variables including device size and material, the test fixture, air flow rate, and air temperature. Because heat is transferred to and from the DUT by forced air convection, the temperature will not necessarily be the same as the air temperature. Even after long "soak" periods, wherein the DUT lies in the airstream for a relatively long period of time, some temperature offset may still exist.

Offset and DUT transition time can be reduced by maximizing the coupling of the airstream with the DUT 20, which is accomplished by the use of the cap 32 and enclosure 34. Cap 32 and enclosure 34 minimize the volume surrounding the DUT. Reduction of the enclosed volume increases the velocity of the air in contact with the DUT. High velocity increases heat transfer. Insulation of the DUT test sockets, not shown, on the tester board 30 will also minimize thermal leakage paths and therefore improve coupling. However, such measures may not satisfactorily overcome these problems, at least in some applications of the system.

The data presented in FIGS. 3 and 4 illustrate typical airstream performance of the ThermoStream System shown in FIGS. 1 and 2. The data represented was obtained using cap 32, enclosure 34, insulated test sockets and an air flow rate of eight SCFM. The various DUTs exhibit different transition times and offsets from the airstream temperature. In FIG. 3 the set point temperature was changed from −50 to +150 degrees Celsius, while in FIG. 4 the set point temperature was changed from +150 to −50 degrees Celsius. Curve A of FIGS. 3 and 4 shows the rate of change of the airstream temperature for each example. Curves B and C of both FIGS. 3 and 4 repectively show the corresponding rates of change in temperature of a typical 14 pin ceramic package and a typical 14 pin plastic package, as the airstream temperature changes according to curve A of the particular Fig. Curves D and E respectively show the corresponding rates of change in temperature of a typical 40 pin ceramic package and a typical 40 pin plastic package, as the airstream temperature changes according to curve A of the particular FIG. 3 and 4. Finally, curve F shows the rate of change of temperature of a typical packaged component system (a TO-3 package) relative to the rate of change of the airstream temperature of the particular FIGS. 3 and 4.

As illustrated by the graphs shown in FIGS. 3 and 4, the various DUTs exhibit different transition times and offsets from the airstream temperature. In general, the smaller devices (e.g., the 14 pin devices) respond more rapidly and have smaller offsets. Larger devices (e.g., the 40 pin devices and the packaged components) respond more slowly and have larger offsets. The test fixture mass is significant in all cases and can be seen in the curve for a 40 pin plastic device of curve 3E where discontinuities are due to heat transfer between the device and its test socket. Higher air flow would reduce transition times and final offsets.

Figure 5:
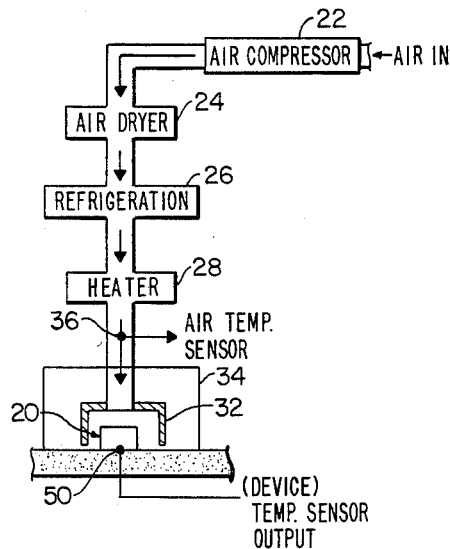
FIG. 5 is a schematic diagram of the preferred embodiment of the apparatus of the present invention.
Figure 6:
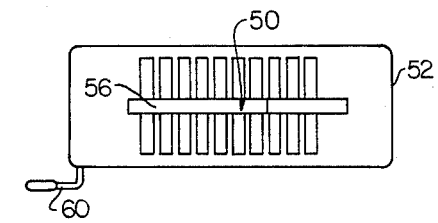
FIG. 6 is a top view of a socket for receiving certain types of DUTs and constructed for use in the FIG. 5 embodiment.
Figure 7:
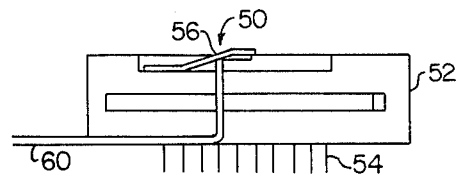
FIG. 7 is a cross-sectional view taken along line 7—7 in FIG. 6.

Better results can be achieved by directly measuring the temperature of the DUT and using the measured temperature of the DUT to control the power applied to the heating unit 28. However, merely substituting a sensor for detetecting the temperature of the DUT 20 for the sensor 36 in a single control loop is not satisfactory for the reasons previously stated above. Preferably, therefore, as shown in FIG. 5, the system of FIG. 1 is modified to include an additional sensor 50, preferably in the form of a low mass thermocouple, for detecting the temperature of the DUT 20. The sensor 50 is preferably disposed so as to be below the DUT 20 so the sensor 50 will be shielded from the high velocity air provided from the heating unit 28 and the sensor will provide a more accurate measurement of the temperature of the DUT. Preferably, the sensor 50 is positioned so as to be centered on and in contact with the bottom surface of the DUT, the area closest to the circuit die. The sensor 50 should provide good sensor contact with the DUT, while minimizing any influence on the temperature of the DUT. Where the DUT is an integrated circuit component, the socket 52 of the type shown in FIGS. 6 and 7 is used to hold the integrated circuit on the tester board 30.

Socket 52 is of a type well known in the art having various electrical leads 54 for conducting various test signals to and from the DUT, and has been modified to include the sensor 50. Sensor 50 is preferably in the form of a leaf spring 56 and a thermocouple junction 58 secured to the spring 56. Spring 56 insures good thermal contact between the DUT and the thermocouple junction 58 when the DUT is placed in the socket. Thermocouple junction 58 is attached to an electrical lead 60 extending from the junction 58 in a direction opposite the DUT, when the latter is in place, so as to minimize the lead's influence on the temperature on the DUT.

In accordance with the present invention the sensor 50 allows for the direct measurement of the temperature of the DUT so as to provide precise DUT temperature control and minimum transition time between various test temperatures. The preferred control system is shown in FIG. 8, wherein the prior art control system of FIG. 2 is modified to include the feedback control of the DUT temperature, thereby providing dual loop control, without the need to significantly modify the prior art system of FIG. 2. More specifically, the output of sensor 50 is connected to the negative input of a second signal summing point 62. The positive input of summing point 62, indicated at 64, receives an electrical signal representative of the set point temperature which is initially determined and set by the operator of the system. The output of the summing 62 therefore forms the error signal representative of the difference between the set point temperature of the DUT 20 and the measured temperature of the DUT. The error signal is applied to the device temperature controller 66. The latter may be any type of analog and/or digital system adapted to carry out the control functions. Preferably, the functions of the signal summing points 42 and 62 and controllers 44 and 66 are all provided by one microprocessor programmed to provide these functions. In addition to being programmed in accordance with the prior art PID algorithm described above, so as to carry out the control functions of air temperature controller 44, the microprocessor is also preferably programmed to carry out the following control function:

$$Asp = \int [(K2\, e + K1\, (de/dt)] dt \qquad (1)$$

wherein:
Asp=air set point;
Dsp=DUT set point;
e=error (Dsp-DUT temperature);
K1=control constant; and
K2=control constant.

As will be more evident hereinafter, an alternative control function can be provided by:

$$Asp = Dsp + K1\, e + K2 \int e\, dt \qquad (2)$$

Figure 10:
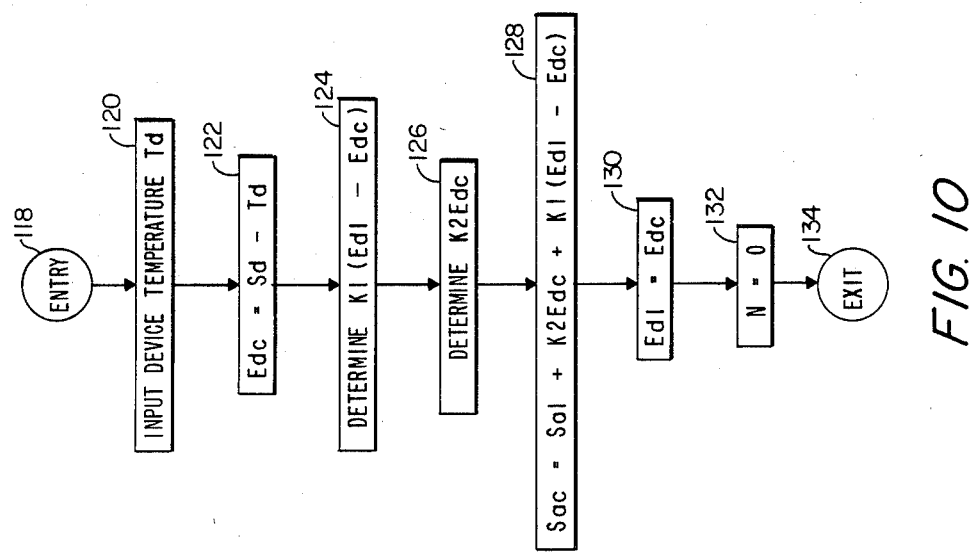
FIG. 10 is a flow chart of a subroutine used in the routine of FIG. 12.
Figure 9:
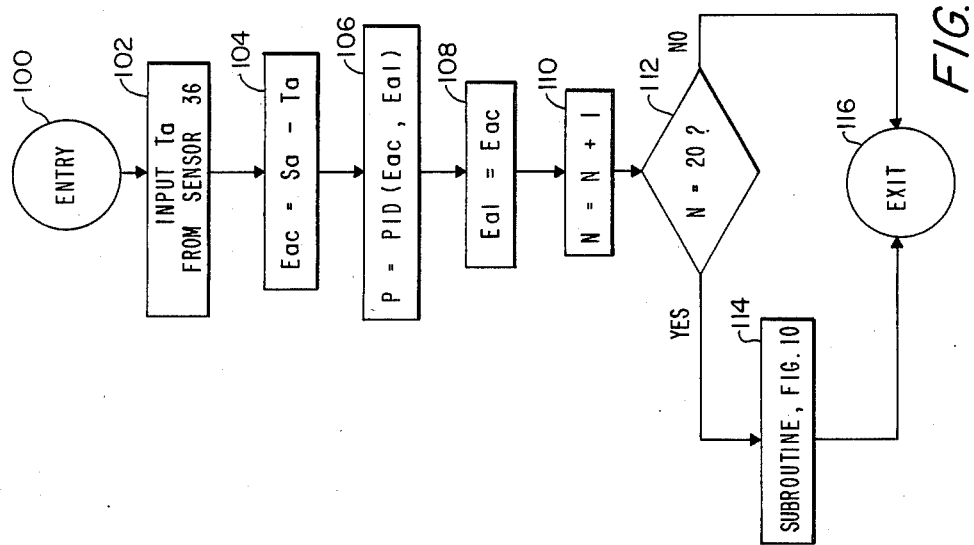
FIG. 9 is a flow chart of the preferred routine of the preferred software program for carrying out the principles of the present invention.

The complete program used in the preferred embodiment so as to carry out the functions of both signal summing points 42 and 62 and both controllers 44 and 66 is attached hereto as Appendix A. The control function of equation (1) is a "proportional-plus-integral" control function, such functions being described, for example, in Bibbero, Robert J.; Microprocessors in Instruments and Control; John Wiley & Sons; 1977; pp. 155-177; and Ogata, Katsuhiko; Modern Control Engineering; Prentice Hall, Inc., of New Jersey; 1970; pp. 151-159. The flow chart of the routine for carrying out these functions is shown in FIGS. 9 and 10. The program is designed to repeatedly execute the routine shown, at equal time intervals, e.g., 20 times a second.

Referring to FIG. 9, each iteration of the routine begins at step 100. At step 102 the value Ta from the sensor 36, indicative of the measured temperature of the gas is provided. Next, at step 104 the current air temperature error, Eac (the output from summing point 42) is determined by subtracting the value of Ta, just calibrated in step 102 from the air set point Sa, determined at step 128, described below, in the previous iteration. Next using the values of the most current air temperature error Eac (provided in step 104) and the last air temperature error Eal calculated at step 108 in the previous iteration at step 108, the power P is calculated using the prior art PID algorithm, which in turn is delivered to the greater unit 28, as indicated at step 108. After the level of power is determined for this iteration, the new value of Eal is set equal to Eac, determined at step 108, for use in the next iteration. Since the DUT temperature moves more slowly than the air temperature, a time multiplexor is preferably provided at steps 110 and 112 so that subroutine 114 is only carried out, for example, every twentieth iteration, e.g., once every second. At step 110, the counter is incremented by one so that N represents the number of the iteration. If N is not 20, i.e., 0–19, the program skips the subroutine 114, and exits the program at 116. The program repeats the iteration by entering the routine at step 100 and carries out steps 102–112. The program will continue to repeat the routine until N=20, whereupon the subroutine 114 is entered at 118, as shown in FIG. 10.

At the first step 120 of the subroutine of FIG. 10, the value Td is provided from the sensor 50. This value is representative of the measured temperature of the DUT 20. At step 122, the current device temperature error (Edc) is determined by subtracting the measured device temperature (determined in step 120) from the device set point, previously set by the operator of the system. The value of Edc, determined in step 122, is then used in step 124 to determine the "difference-proportional to rate of change of the device temperature error" term K1(Edl−Edc), wherein the constant K1 has been previously determined, Edl is the last device temperature error provided at step 130 in the previous iteration, and Edc has just been determined at step 122. Next, the step 126 is performed in which the "proportional to device temperature error" term K2Edc is determined, wherein the constant K2 has been previously determined and Edc, the current device temperature error was determined in step 122. The current air set point temperature Sac can now be determined at step 128 by adding the current air set point temperature Sal, previously determined in the last iteration to the values of the terms determined in steps 124 and 126. At step 130 the last device temperature Edl is set equal to the current device temperature Edc, determined in step 122, for the next iteration. The counter is set to zero at step 132 and the subroutine exits at step 134. As shown in FIG. 9, the routine now exits at 116. The program will begin the next iteration at the appropriate time.

In operation, the dual loop control configuration shown in FIG. 8 provides effective temperature control of the DUT 20 by operation of both control loops. Tests of various sized component packages have shown that the dual loop control system of FIG. 8 is less sensitive to the thermal characteristics of various DUTs than single loop control of detecting only the temperature of the DUT. Typical steady state accuracy of the system was + or −0.4 degrees Celsius. Device temperature overshoot was usually less than two degrees Celsius. This FIG. 8 control system also reduces the DUT temperature transition time.

In a demonstration of the principles of the present invention the microprocessor of the ThermoStream System was programmed in accordance with the routine provided in the flowcharts of FIGS. 9 and 10. The microprocessor of the ThermoStream System therefore controlled DUT temperature. The ThermoStream System can include device temperature indication and permit air/device control selection. If desired the ThermoStream System can be controlled and device temperature and status read by using a IEEE-488 Option, described in greater detail hereinafter.

Figure 11:
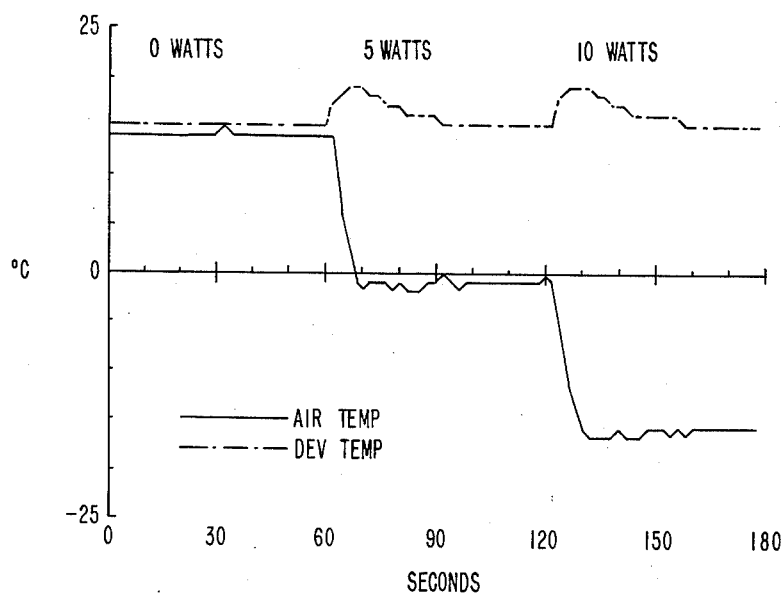
FIG. 11 is a graphical representation of the response of the temperature of the airstream in response to a step change in the dissipation of heat from a DUT in order to maintain the DUT at a constant temperature in the FIG. 5 system.

A test was performed on a five volt regulator integrated circuit in a TO-3 package using the single microprocessor to carry out the summing point (42 and 62) and controller (44 and 66) functions. The DUT, thus under DUT control by the modified ThermoStream microprocessor, was held at +15 degrees Celsius in an air flow of ten SCFM (five liters/second) while the power dissipation of the device was changed from zero watts during the first 60 seconds, to five watts during the second 60 seconds, and to ten watts during the last sixty seconds of the test. FIG. 11 shows that the air temperature responded to the step change in device heat dissipation to maintain the device at the 15 degree Celsius setpoint. The device temperature was raised by four degrees by the step change in power but was within two degrees Celsius of setpoint in 18 seconds and reestablished at the setpoint in 30 seconds. The curves 3F and 4F in FIGS. 3 and 4 show the TO-3 package to have the largest offset from air temperature of the devices tested but the use of the modified ThermoStream System eliminates the offset even when the device is dissipating considerable power. The steady state accuracy of this system is typically less than + or −0.2 degrees Celsius.

In a more simplified embodiment of the present invention the ThermoStream System of FIG. 2 can be modified to include an external controller, such as a personal computer Model HP-85 manufactured by Hewlett Packard of California with a parallel interface bus, such as a IEEE-488 option, sold as the HPIB, and a sensor 50 for detecting the DUT temperature. The added external computer and IEEE-488 option provides both an external controller to vary the air setpoint input 40 to the existing control system of the ThermoStream System, shown in FIG. 2, and readings of both air temperature and system status. DUT temperature can be measured with a Hewlett Packard Model 3421A Data Acquisition/Control Unit with Option 20 and the IEEE-488 option. The DUT temperature can be measured by the ThermoStream System and transferred to the HP-85 on the IEEE-488 option. The HP-85 controller calculates the setpoints for the airstream system and transfers the setpoints to the ThermoStream System via the IEEE-488 option.

The external controller is programmed to execute the control function of equation (2) above. The program for executing this equation is shown in FIG. 12.

Line 120 of FIG. 12 provides the control constants, K1 and K2. Line numbers 530 and 532 of FIG. 12 are limits on the air setpoint. These latter limits can be set to whatever values are necessary to protect the DUT. Lines 526 and 527 limit the value of the integral term of the control function (2) to + or − ten degrees Celsius. These limits reduce the intergration effects during transients. The intergration will maintain a steady offset between air and device temperature of up to ten degrees Celsius.

Figure 13:
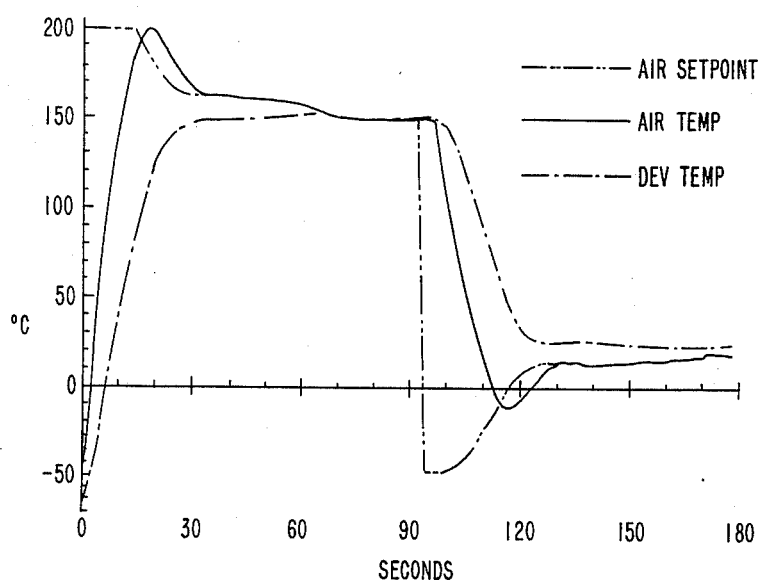
FIG. 13 is a graphical representation of an example of the rate of change of the temperature of the airstream and a sample DUT in the system of FIG. 5, using the program illustrated in FIG. 12.

In order to demonstrate the principles of the use of such an external controller on the FIG. 2 system, a 14 pin plastic component was tested on a ThermoStream System, modified to include the HP-85 and IEEE-488 option, as described above. Results of the test on a 14 pin plastic component package are shown in FIG. 13. Initially, both the air and the DUT were at −65 degrees Celsius. The device set point was raised to 150 degrees.

The control program raised the air setpoint to the upper limit of 200 degrees Celsius, the air temperature rose to 200 degrees Celsius and then decreased to 150 degrees as the device error decreased. At 90 seconds the device setpoint was changed to 25 degrees Celsius and similar control action was observed. Comparing FIG. 13 with the curve 3C of FIG. 3, it can be seen that without using the sensor 50 to detect the temperature of the 14 pin plastic component package, the system of FIG. 2 took more than 100 seconds for the device temperature to approach within one degree of the 150 degree air temperature, but in the dual loop configuration of FIG. 8, the FIG. 8 system took approximately 50 seconds for the DUT to come to that temperature.

Closing the control loop therefore has considerable advantages over the Thermostream System shown in FIG. 2. The system and method of the present invention provide a precise measure and control of the temperature of a DUT through a range of temperatures. The system and method quickly and accurately bring the temperature of a DUT to the desired preset temperature, and precisely control the temperature of a DUT through a range of temperatures substantially independently of thermal coupling between the DUT and the testing circuitry, and the internal heat dissipation of the DUT. The system and method of the present invention can be easily employed in the prior art ThermoStream System of FIG. 2 with a minimum number of modifications. The system and method of the present invention are capable of controlling the temperature of a DUT substantially at a desired preset temperature by directly measuring the temperature of the DUT, without wide fluctuations in the temperature of the airstream, and without offsets required in the prior art ThermoStream System of FIG. 2. Finally, the temperature of the airstream can vary, while the DUT is held at a steady state temperature, allowing variations in internal heat dissipation of the DUT without appreciably affecting DUT temperature.

Since certain changes may be made in the above apparatus without departing from the scope of the invention herein involved, it is intended that all matter contained in the above description or shown in the accompanying drawings shall be interpreted in an illustrative and not in a limiting sense.

What is claimed is:

1. In a system for precisely controlling the temperature of a substantially solid object through a range of temperatures, said system including (a) support means for supporting said object; (b) means, responsive to a control signal, for contorlling the temperature of a fluid; (c) means for directing said fluid into direct contact with an object supported by sa support means so as to control the temperature of said object; (d) menas for generaitng a first signal as a function of the current temperature of said fluid; (e) means for generating a second signal as a function of the desired temperature of said fluid; and (f) means for generating said control signal as a function of the different between said first and second signals; wherein the improvement comprises:

said means for generating said second signal as a function of the desired temperature of the fluid includes means for generating said second signal as a function of the difference between the desired temperature of said object and the actual tmeperature of said object.

2. The system according to claim 1, wherein said means for generating said second signal as a function of the difference between the desired temperature of said object and the actual temperature of said object includes sensing means for sensing the temperature of said object at a location so as to substantially minimize the effect of said fluid on said sensing means.

3. The system according to claim 2, wherein said means for directing said fluid into direct contact with said object directs said fluid in a predetermined direction so as to contact the portions of said object opposite said location.

4. The system according to claim 1, wherein said means for generating said second signal includes means for performing the following control function:

$$Asp = \int [[K2*E] + K1\,(dE/dt)] dt$$

wherein:
Asp = the desired temperature of said fluid;
Dsp = the desired temperature of said object;
E = error (the desired temperature of said object minus the measured temperature of said object);
K1 = control constant; and
K2 = control constant.

5. A system according to claim 1, wherein said means for generating said second signal includes means for performing the following control function:

$$Asp = Dsp + K1*E + K2 \int E dt$$

wherein:
Asp = the desired temperature of said object;
E = error (the desired temperature of said object minus the measured temperature of said object)
K1 = control constant; and
K2 = control constant.

6. In a system for precisely controlling the temperature of a substantially solid object through a range of temperatures, said system comprising:
supporting means for supporting said object;
means responsive to a first signal, for controlling the temperture of a gas;
means for directing said gas directly into contact with an object supported by said supporting means;
means for measuring the temperature of said gas and for generating a second signal as a function of said measured temperature of said gas;
means for measuring the temperature of said object and for generating a third signal as a fuuction of said measured temperature of said object;
means for generating a fourth signal as a function of the desired temperature of said object;
means for generating a fifth signal as a function of the difference between said third and fourth signals; and
means for generating said first signal as a function of said fifth signal.

7. A system according to claim 6, wherein said means for controlling the temperature of said gas includes means for cooling said gas below ambient temperature and means, responsive to said first signal, for heating said cooled gas.

8. A system according to claim 7, wherein said means for directing said gas into direct contact with said object includes gas compressor means for compressing gas and forcing said gas through said means for cooling and said means for heating prior to forcing said gas into contact with said object.

9. A system according to claim 7, wherein said means for directing said gas into direct contact with said object includes means for defining a predetermined path of said gas from said means for heating said gas to said object, wherein said means for measuring the temperature of said gas is disposed in the path of said gas between said heater means and said object.

10. The system according to claim 9, wherein said means for measuring the temperature of said object is located relative to said object so as to be shielded from said gas by said object when said gas is forced into contact with said object.

11. The system according to claim 9, wherein said means for measuring the temperature of said object is located relative to said object so as to substantially minimize the effect of the temperature of said gas on said means for measuring the temperature of said object.

12. A system according to claim 6, further including means for generating a sixth signal, representative of the desired temperature of said gas and a function of said fifth signal, wherein said first signal is a function of the difference between said sixth signal and said second signal so as to represent the difference between the desired and measured temperature of said gas.

13. system according to claim 12, wherein said means for generating said sixth signal includes means for performing the following control function:

$$Asp = Dsp + K1*E + K2 \int E dt$$

wherein:
Asp = the desired temperature of said gas;
Dsp = the desired temperature for said object;
E = error (the desired temperature of said object minus the measured temperature of said object).
K1 = control constant; and
K2 = control constant.

14. The system according to claim 12, wherein said means for generating said second signal includes means for performing the following control function:

$$Asp = \int [K2*E + K1(dE/dt)] dt$$

wherein:
Asp = the desird temperature of said gas;
Dsp = the desired temperature of said object;
E = error (the desired temperature of said object minus the measured temperature of said object)
K1 = control constant; and
K2 = control constant.

15. A method of controlling the precise temperature of an object under test through a range of temperatures by controlling the temperature of a fluid forced into direct contact with said object so that the object can be tested at each of various temperatures within said range, said method comprising the steps of:
supporting said object so that said fluid directly contacts said object;
setting the desired temperature of the supported object;
measuring the current temperature of the supported object;
determining the difference between the desired temperature of the supported object and the measured temperature of the supported object;
determining the desired temperature of the fluid as a function of the difference between the desired temperature of the supported object and the measured temperature of the supported object;
measuring the actual temperature of the fluid; and
controlling the temperature of said fluid as a function of the difference between the desird temperature and the actual temperature of the fluid.

16. The method according to claim 15, wherein the step of determining the desired temperature of said fluid as a function of the difference between the desired temperature of the supported object and the measured temperature of the supported object is determined in accordance with the following relationship:

$$Asp = Dsp + K1*E + K2 \int E dt$$

wherein:
Asp = the desired temperature of said fluid;
Dsp = the desired temperature of said object;
E = error the (the desired temperature of said object minus the measured temperature of said object)
K1 = control constant; and
K2 = control constant.

17. The method according to claim 15, wherein the step of determining the desired temperatur of said fluid as a function of the difference between the desired temperature of the object and the measured temperature of the object is determined in accordance with the following relationship:

$$Asp = \int [K2*E + K1(dE/dt)] dt$$

wherein:
Asp = the desired temperature of said fluid;
Dsp = the desired temperature of said object;
E = error (the desired temperature of said object minus the measured temperature of said object)
K1 = control constant; and
K2 = control constant.

* * * * *

UNITED STATES PATENT AND TRADEMARK OFFICE
CERTIFICATE OF CORRECTION

PATENT NO. : 4,734,872

DATED : March 29, 1988

INVENTOR(S) : George Eager; Pater Selverstone

It is certified that error appears in the above-identified patent and that said Letters Patent is hereby corrected as shown below:

Claim 1, column 11, line 52, delete "contorlling" and substitute therefor -- controlling --;

Claim 1, column 11, line 54, delete "sa" and substitute therefor -- said --;

Claim 1, column 11, line 55, delete "menas" and substitute therefor -- means --;

Claim 1, column 11, line 56, delete "generaiting" and substitute therefor -- generating -- ;

Claim 1, column 11, line 60, delete "different" and substitute therefor -- difference --;

Claim 6, column 12, line 43, delete "temperture" and substitute therefor -- temperature --;

Claim 13, column 13, line 25, before "system" insert -- A --;

Claim 13, column 13, line 33, delete "for" and substitute therefor -- of --;

Claim 14, column 13, line 44, delete "desird" and substitute therefor -- desired --;

Claim 15, column 14, line 19, delete "desird" and substitute therefor -- desired --;

UNITED STATES PATENT AND TRADEMARK OFFICE
CERTIFICATE OF CORRECTION

PATENT NO. : 4,734,872

DATED : March 29, 1988

INVENTOR(S) : George Eager; Pater Selverstone

It is certified that error appears in the above-identified patent and that said Letters Patent is hereby corrected as shown below:

Claim 16, column 14, line 33, delete "the" (1st occurrence); and

Claim 17, column 14, line 38, delete "temperatur" and substitute therefor -- temperature --.

Signed and Sealed this

Eleventh Day of October, 1988

Attest:

DONALD J. QUIGG

*Attesting Officer*    Commissioner of Patents and Trademarks

UNITED STATES PATENT AND TRADEMARK OFFICE
CERTIFICATE OF CORRECTION

PATENT NO.   :   4,734,872

DATED        :   March 29, 1988

INVENTOR(S) :   George Eager & Peter Selverstone

It is certified that error appears in the above-identified patent and that said Letters Patent is hereby corrected as shown below:

On the title page, in item 75, please delete the inventor's name "Pater Selverstone" and substitute therefor his correct name -- Peter Selverstone --.

Claim 1, column 11, line 67, delete "tmeperature" and substitute therefor --temperature--.

Signed and Sealed this

Twenty-ninth Day of November, 1988

Attest:

DONALD J. QUIGG

Attesting Officer

Commissioner of Patents and Trademarks